(12) United States Patent
Nambu

(10) Patent No.: US 8,021,899 B2
(45) Date of Patent: Sep. 20, 2011

(54) METHOD OF MANUFACTURING A SEMICONDUCTOR DEVICE INCLUDING OPTICAL TEST PATTERN ABOVE A LIGHT SHIELDING FILM

(75) Inventor: Hidetaka Nambu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/855,906

(22) Filed: Aug. 13, 2010

(65) Prior Publication Data

US 2010/0304508 A1    Dec. 2, 2010

Related U.S. Application Data

(62) Division of application No. 12/323,614, filed on Nov. 26, 2008, now Pat. No. 7,800,108.

(30) Foreign Application Priority Data

Nov. 30, 2007  (JP) ................. 2007-309937

(51) Int. Cl.
  *H01L 21/66*   (2006.01)
  *H01L 31/66*   (2006.01)
  *H01L 21/4763* (2006.01)

(52) U.S. Cl. .................. 438/18; 438/637; 438/638

(58) Field of Classification Search ............ 438/18, 438/637, 638; 257/E21.585
See application file for complete search history.

(56) References Cited

U.S. PATENT DOCUMENTS

| | | |
|---|---|---|
| 7,242,477 B2 | 7/2007 | Mieher et al. |
| 7,265,382 B2 | 9/2007 | Lymberopoulos et al. |
| 7,586,143 B2 | 9/2009 | Watanabe |
| 2001/0015811 A1 | 8/2001 | Ravid et al. |
| 2006/0264033 A1 | 11/2006 | Olmen et al. |

FOREIGN PATENT DOCUMENTS

| | | |
|---|---|---|
| JP | 2002-93870 | 3/2002 |
| JP | 2003-229414 | 8/2003 |
| JP | 2006-506812 | 2/2006 |
| JP | 2006-73701 | 3/2006 |
| JP | 2006-518942 | 8/2006 |
| JP | 2006-295171 | 10/2006 |

*Primary Examiner* — William M. Brewster
(74) *Attorney, Agent, or Firm* — Young & Thompson

(57) ABSTRACT

The semiconductor device of the present invention includes a first insulating film on a substrate having a first region and a second region, a light shielding film formed in the first region and an interconnect film formed in the second region in the first insulating film and a second insulating film having a first concave portion above the light shielding film in the first region and an interconnect hole having a via hole and a second concave portion in the second region in the second insulating film on the first insulating film, wherein an area of the light shielding film is overlapping an area of the first plurality of concave portions.

7 Claims, 7 Drawing Sheets

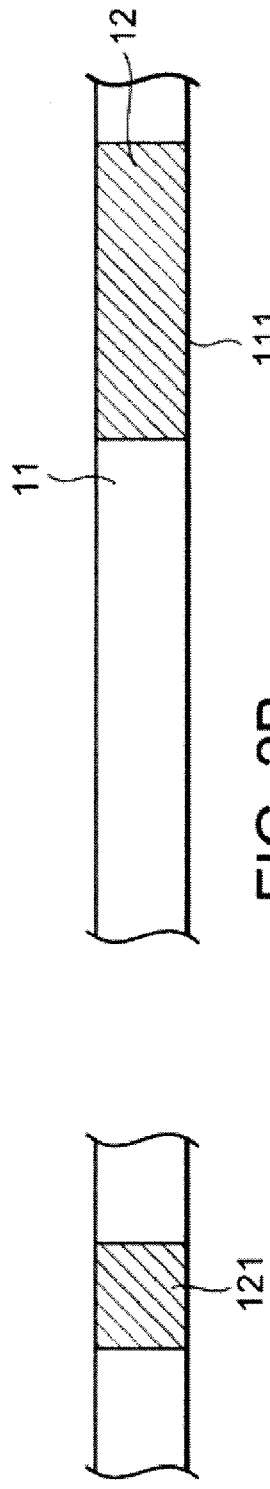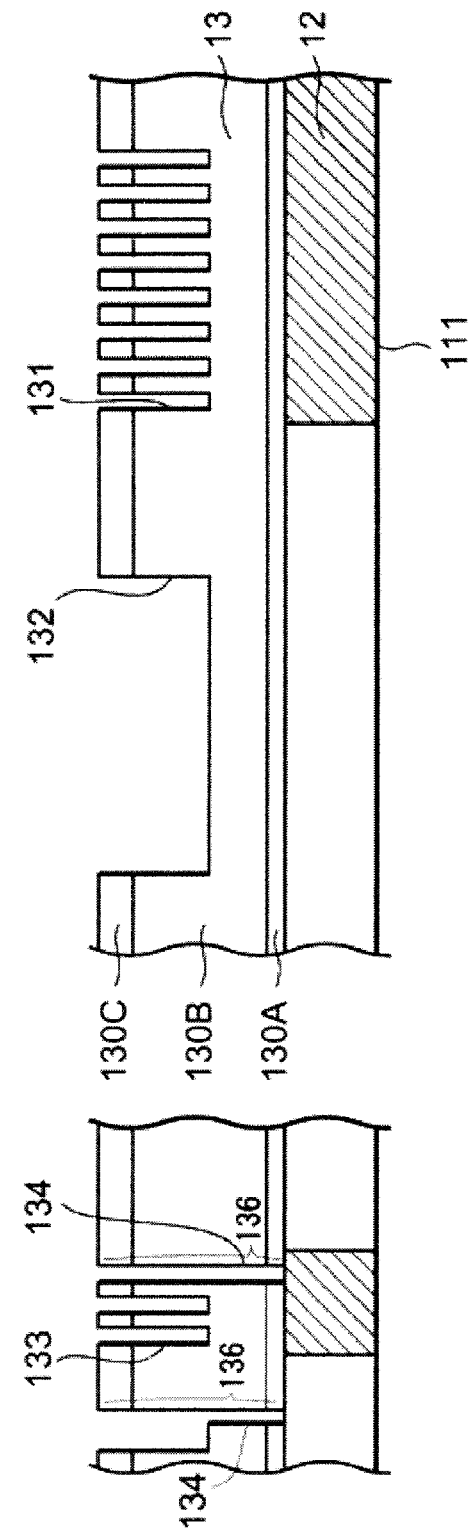

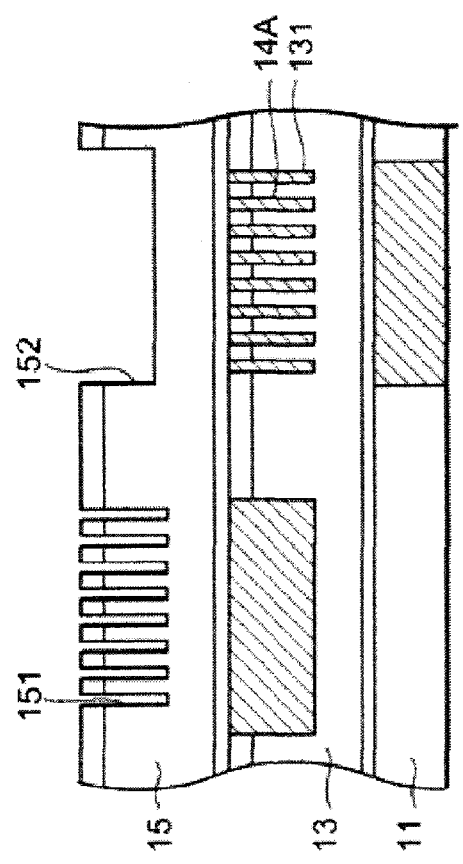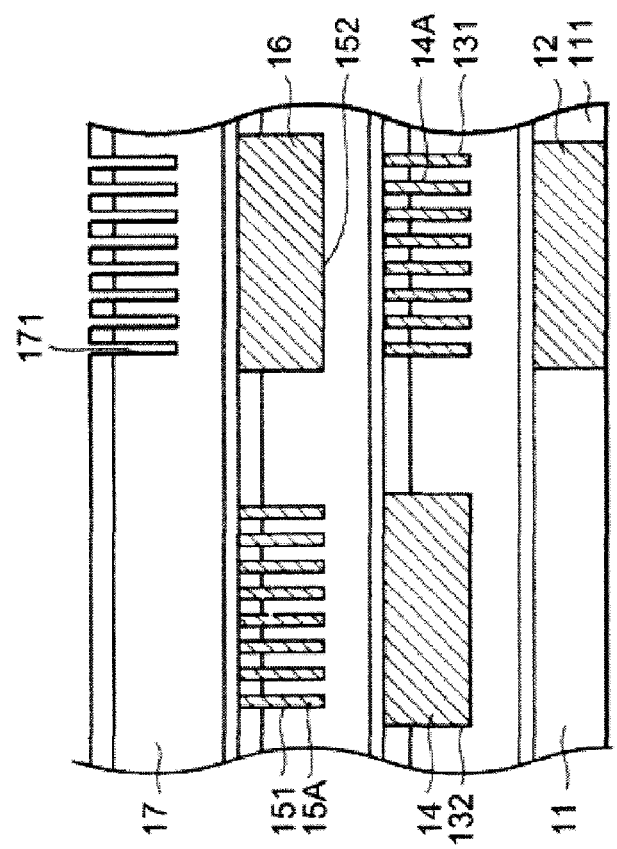
FIG. 3A
FIG. 3B
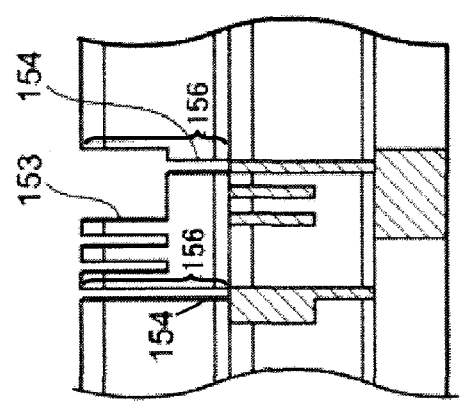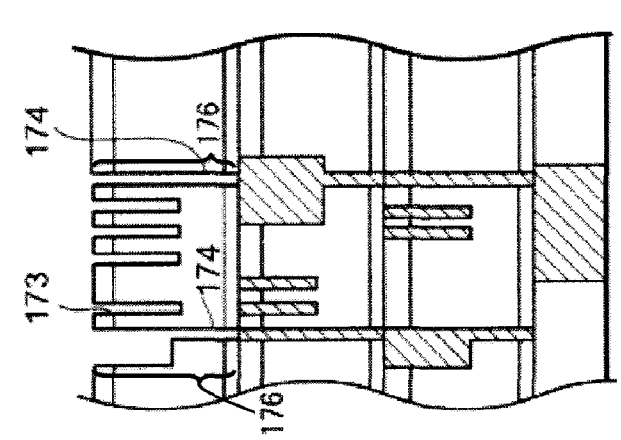

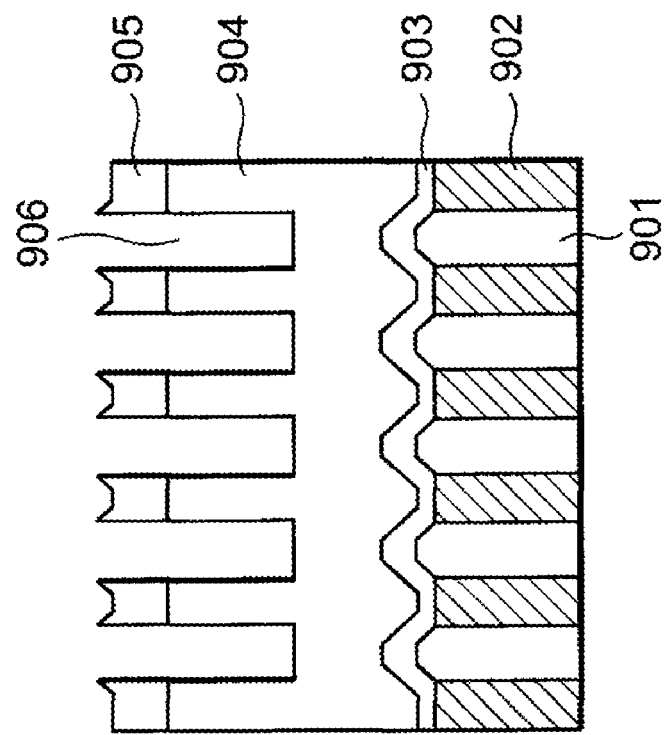
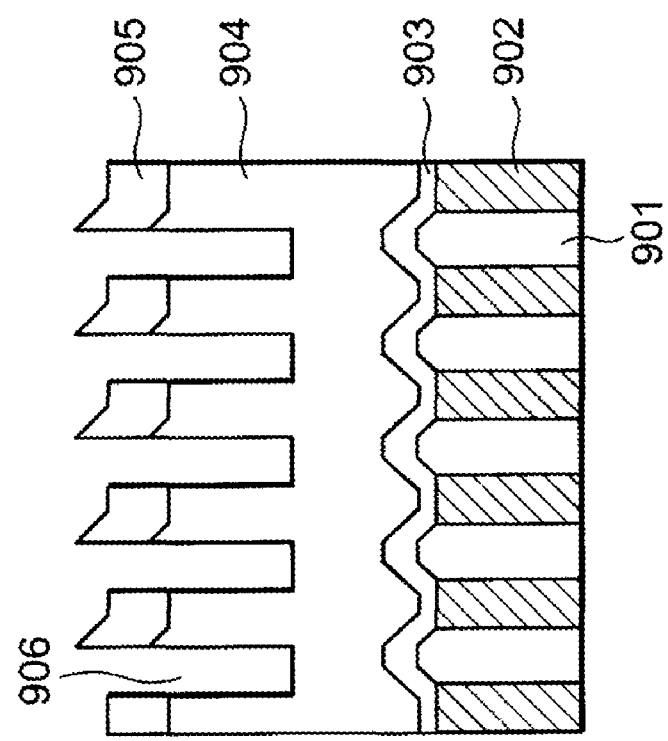

METHOD OF MANUFACTURING A SEMICONDUCTOR DEVICE INCLUDING OPTICAL TEST PATTERN ABOVE A LIGHT SHIELDING FILM

The present application is a DIVISIONAL of U.S. patent application Ser. No. 12/323,614, filed on Nov. 26, 2008, which is now U.S. Pat. No. 7,800,108, which is incorporated herein by reference.

The present application is based on Japanese Patent Application No. 2007-309937.

BACKGROUND OF THE INVENTION

The present invention relates to a semiconductor device and a method of manufacturing a semiconductor device.

In a conventional process of manufacturing a semiconductor device, there is adopted a method of forming trenches and via holes in an insulating film by etching, embedding metal layers in the formed trenches and the via holes and forming interconnect.

Shapes of the trenches and the via holes (hereinafter referred to as "trenches or the like") are conventionally controlled based on an etching time, but the control based on an etching time involves a problem that it is difficult to accurately grasp the shapes of the trenches or the like. Japanese Patent Laid-Open No. 2006-295171, for example, discloses a method to form interconnect by via-first method.

Japanese Patent Laid-Open No. 2006-073701 discloses a monitoring method of etching rate by optical microscope when a film with mask is etched to expose an underlying another film.

Japanese Patent Laid-Open No. 2003-229414, Japanese Patent Laid-Open No. 2002-93870, National Publication of International Patent Application No. 2006-506812 and National Publication of International Patent Application No. 2006-518942 disclose a method of irradiating light onto trenches or the like and grasping shapes of the trenches or the like from reflected light (e.g., scatterometry method, OCD (Optical Critical Dimension) measurement. Scatterometry method (or OCD measurement) generally includes both single wavelength—multi angle optical scattering method and multi-wavelength—single angle optical scattering method one.

For example, Japanese Patent Laid-Open No. 2003-229414 and Japanese Patent Laid-Open No. 2002-93870 disclose a method of irradiating light onto an insulating film in which a trench or the like is formed and detecting reflected light from the insulating film. The shape of the trench is grasped based on intensity of this reflected light.

According to this method, an interconnect layer is disposed below the trench to be measured. The shape of the trench is measured using light of a wavelength-band in which the utilized wavelength is larger than twice the wiring space of the interconnect layer below the trench to be measured. This inhibits the light from passing through the interconnect layer and prevents the unfavorable reflection from the materials and/or features underlying the interconnect layer.

For example, the interconnect layer is composed of a striped tungsten metal film having a width of 175 nm, thickness of 250 nm and a pitch of 350 nm, and the wiring space is assumed to be 175 nm. The wavelength-band of light used for measurement is assumed to be 900 nm to 1600 nm.

However, the present inventor found out that the measuring methods disclosed in the related arts have the following problems.

When forming an interconnect layer, a trench is formed in an insulating film, this trench is filled with a metal film, the metal film is then polished and removed by CMP (Chemical Mechanical polishing). In this case, erosion occurs as shown in FIG. 6.

In FIG. 6, reference numeral 901 denotes an insulating film, 902 denotes a metal film, 903 denotes an etching stopper film, 904 denotes an interlayer insulating film and 905 denotes a cap film.

As shown in FIG. 6, steps are produced on the surface of the cap film 905 at the top of the interconnect layer and the surface undulates due to the influence of erosion.

When a trench is formed in such a condition, as shown in FIGS. 7A and 7B, the shape of the trench 906 varies a great deal due to a difference in positions at which the opening of a mask is formed. Therefore, it is difficult to fix the measuring condition of the trench 906 to a certain condition, which affects productivity.

Furthermore, since the steps are produced on the surface of the cap film 905 due to the influence of erosion, the steps remain on the surface of the cap film 905 even after the trench 906 is formed. In this case, the measuring light is reflected by the steps and erroneous information is likely to occur when the trench 906 is measured.

SUMMARY

The present invention provides a semiconductor device comprising, a first insulating film on a semiconductor substrate having a first region and a second region, a light shielding film formed in the first region and an interconnect film formed in the second region in the first insulating film and a second insulating film having a first concave portion above the light shielding film in the first region and an interconnect hole having a via hole and a second concave portion in the second region in the second insulating film on the first insulating film, wherein an area of the light shielding film is overlapping an area of the first plurality of concave portions.

According to the present invention, the area of the light shielding film is overlapping the area of the first plurality of concave portions, and therefore when the light shielding film is polished CMP, it is possible to inhibit erosion from occurring in the first insulating film.

Erosion is generally a phenomenon that occurs when the interconnect pitch is narrow and densely arranged, and erosion occurs conspicuously when the interconnect width is 1.6 μm or less.

On the contrary, as in the case of the present invention, the area of the light shielding film is overlapping the area of the first plurality of concave portions and when the distance from the center to the outer perimeter of the light shielding film is assumed to be 2 μm or more and the light shielding film having a large plane shape is formed, it is possible to reliably prevent erosion from occurring.

In this way, even when an error occurs in the position at which the opening of a mask is formed when a concave portion is formed, it is possible to suppress variations in the shape of the concave portion formed in the second insulating film. Therefore, it is possible to conduct measurement by determining a measuring condition to a certain condition and improve productivity of the semiconductor device.

Furthermore, since the occurrence of erosion is prevented, it is possible to inhibit steps from being formed on the surface of the insulating film as in the cases of the related arts and prevent measuring light from being reflected by the steps, producing measurement errors when measuring the concave portion.

Furthermore, since the distance from the center to the outer perimeter of the light shielding film in a plan view is assumed to be 2 μm or more, it is possible to effectively intercept information of layers underlying the light shielding film when irradiating light, detecting reflected light and measuring the shape of the concave portion.

Furthermore, the present invention can also provide a method for manufacturing a semiconductor device as follows.

That is, the present invention can provide a method of manufacturing a semiconductor device comprising, forming a first insulating film on a semiconductor substrate having a first region and a second region, forming a first via hole in the second region in the first insulating film, forming a reservoir region in the first region and a trench in the second region to connect with the first via to form a first interconnect hole in the first insulating film, forming a metal film on the first insulating film to fill the reservoir region and the first interconnect hole, performing polishing so as to leave the metal film in the reservoir region to form light shielding film and in the first interconnect hole to form interconnect, forming a second insulating film on the first insulating film, forming a second via hole in the second region in the second insulating film, forming a first plurality of concave portions above the light shielding film in the first region and a second concave portion in the second region to connect with the second via to form a second interconnect hole in the second insulating film, wherein an area of the light shielding film is overlapping an area of the first plurality of concave portions.

BRIEF DESCRIPTION OF THE DRAWINGS

The above and other objects, advantages and features of the present invention will be more apparent from the following description taken in conjunction with the accompanying drawings, in which:

FIGS. 2A and 2B are cross-sectional views showing manufacturing steps of a semiconductor device;

FIGS. 3A and 3B are cross-sectional views showing manufacturing steps of a semiconductor device;

FIGS. 7A and 7B show a related art of a semiconductor device.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

With reference now to the attached drawings, embodiments of the present invention will be explained below.

First Embodiment

A first embodiment of the present invention will be explained with reference to FIGS. 1 to 4.

First, an overview of a semiconductor device 1 of the present embodiment will be explained.

Figure 1:
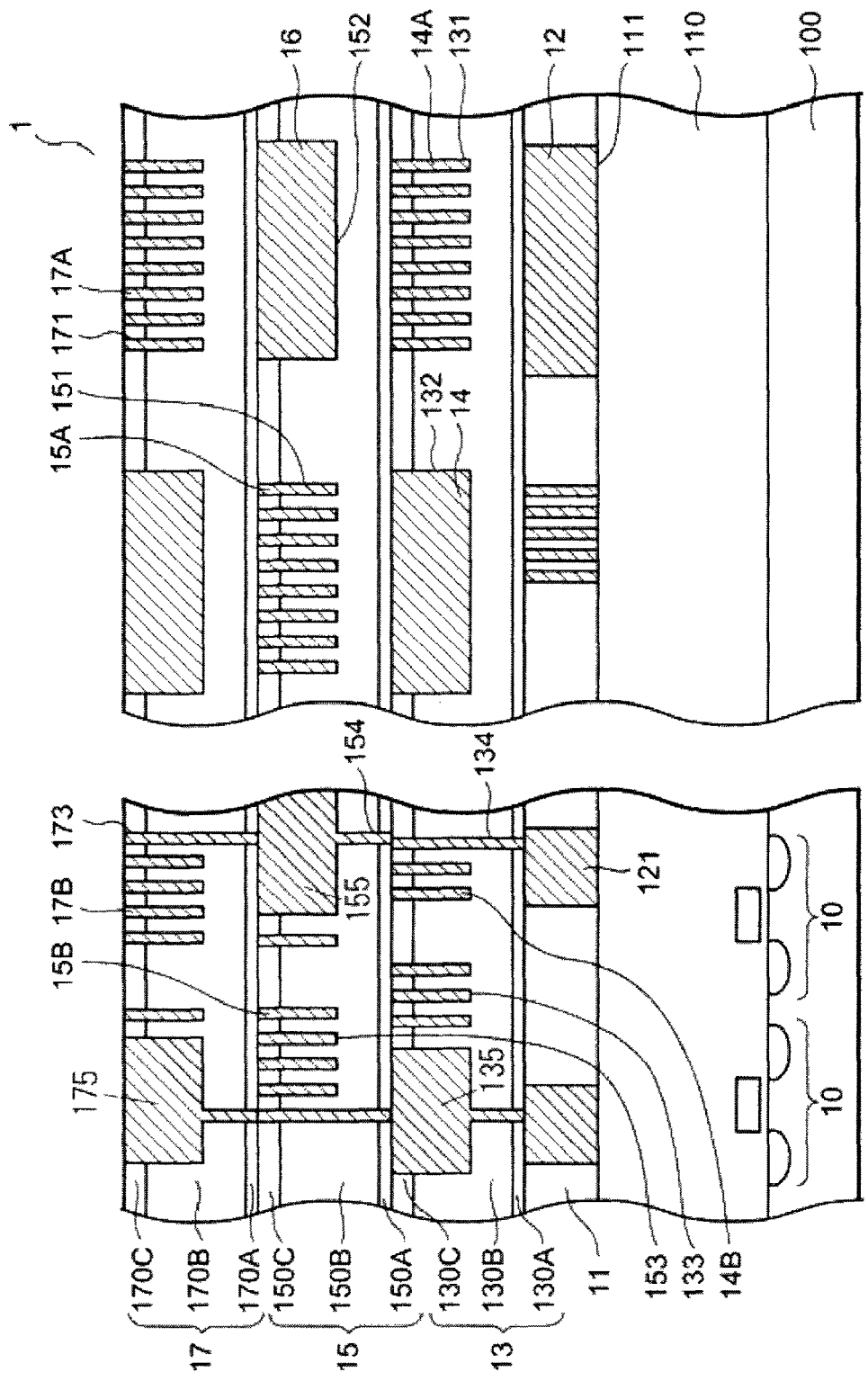
FIG. 1 is a cross-sectional view showing a semiconductor device according to a first embodiment of the present invention.

As shown in FIG. 1, the semiconductor device 1 has a flat-film-shaped first light shielding film 12 formed in a first insulating film 11 and a second insulating film 13 provided on the first light shielding film 12 in which a plurality of concave portions 131 are formed. The plurality of concave portions 131 of the second insulating film 13 is located above the first light shielding film 12. The preferable area of the light shielding film 12 is an area of the circle of 2 μm or more in the radius.

Next, the semiconductor device 1 will be explained in detail.

The semiconductor device 1 is formed like a wafer in which a plurality of circuit regions is formed and a scribe region is formed between the circuit regions.

In addition to the above described first insulating film 11, first light shielding film 12 and second insulating film 13, the semiconductor device 1 has a second light shielding film 14, a third insulating film 15, a third light shielding film 16, a fourth insulating film, and further a semiconductor substrate 100 on which the first insulating film 11 to the fourth insulating film 17 are multilayered.

Here, the semiconductor device in which only four insulating films are multilayered is disclosed, but the multilayer structure of the semiconductor device is not limited to this.

The first insulating film 11 is formed on a semiconductor substrate 100, for example, a silicon substrate such as a SiO2 film. The semiconductor substrate may be provided with semiconductor elements such as the transistor 10 having the gate structure and the diffusion region in the insulator layer 110 as indicated in FIG. 1.

The first insulating film 11 is formed extending over the circuit region to the scribe region. At the location of the scribe region of this first insulating film 11, a reservoir region (first reservoir region) 111 is formed.

This reservoir region 111 has a distance from the center to the outer perimeter of 2 μm or more when seen from the substrate surface. The reservoir region 111 according to the present embodiment has a plane rectangular shape, and one side has, for example, 5 μm or more. Above all, one side preferably has 30 μm or more. Furthermore, one side more preferably has 80 μm or less.

The first light shielding film 12 is embedded in this reservoir region 111.

In a plan view seen from the substrate side, the distance from the center (center of gravity) to the outer perimeter of the first light shielding film 12 is 2 μm or more. More specifically, the first light shielding film 12 is formed according to the shape of the reservoir region 111 and has a plane rectangular shape when seen from the substrate side. One side of the first light shielding film 12 is 5 μm or more. Above all, the size of the first light shielding film 12 in the plan view seen from the substrate side is preferably equal to or greater than the light spot size of measuring light which will be described later, and more specifically, the distance from the center to the outer perimeter is preferably 15 μm or more. Furthermore, in the plan view seen from the substrate side, the distance from the center to the outer perimeter of the first light shielding film 12 is preferably 40 μm or less.

Figure 4:
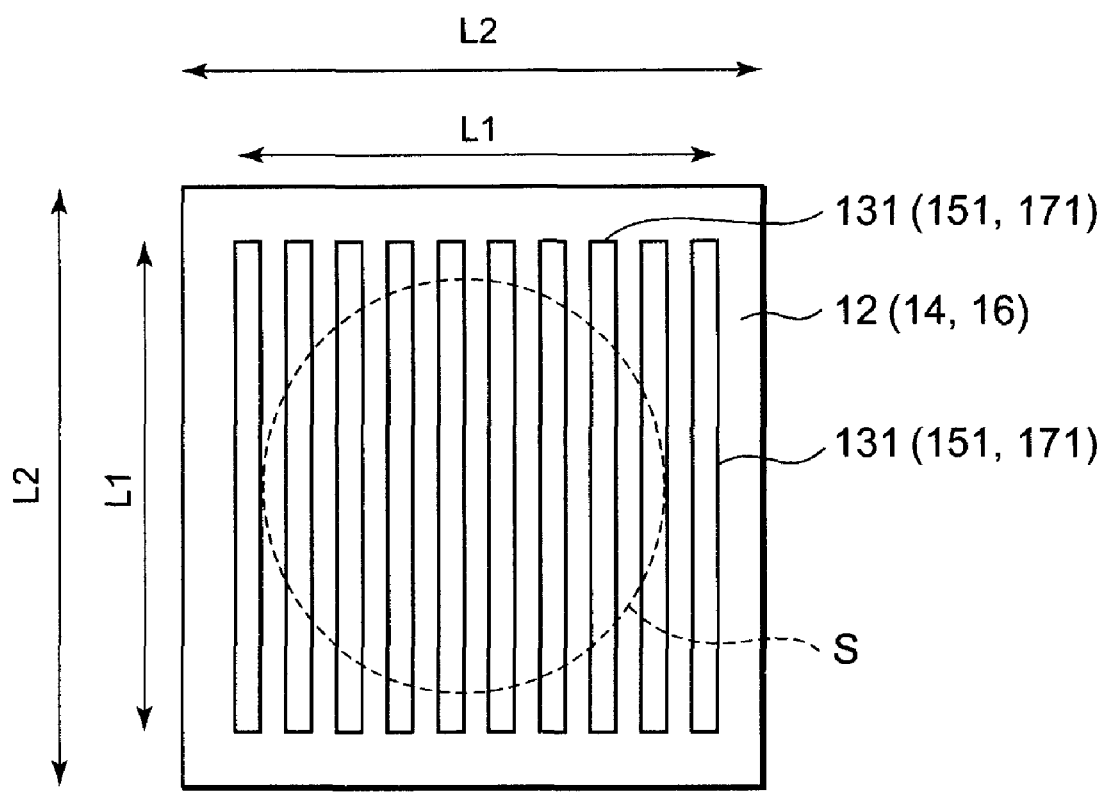
FIG. 4 is a plan view showing a relationship between a spot size of measuring light, grooves and light shielding film.

According to the present embodiment, more specifically, the first light shielding film 12 has a plane square shape and a length L2 of one side is 60 μm as shown in FIG. 4. Though details will be described later, when the shape of the groove 131 is measured, an alignment error between a stage on which the semiconductor device is set and an irradiation section which irradiates measuring light is taken into consideration, the length L2 is set to be equal to or greater than the sum of the spot size of measuring light and the alignment error.

Furthermore, the thickness of the first light shielding film 12 is, for example, 0.1 µm to 1.2 µm.

This first light shielding film 12 is made of metal, copper or a copper alloy in the present embodiment.

The second insulating film 13 is provided on the first insulating film 11 and is configured by including a low dielectric constant film having a dielectric constant of, for example, 3.5 or less. The second insulating film 13 is a multilayer film in which, for example, a SiCN film 130A, SiOC film 130B and SiO2 film 130C are multilayered in that order.

The second insulating film 13 as well as the first insulating film 11 is formed extending over the circuit region to the scribe region. A reservoir region (second reservoir region) 132 and the plurality of grooves 131 (first concave portion) are formed in the part located in the scribe region of this second insulating film 13. The reservoir region 132 is formed at a predetermined distance from the plurality of grooves 131.

The reservoir region 132 and grooves 131 penetrate the SiO2 film 130C of the second insulating film 13 and reach a midway position of the thickness of the SiOC film 130B.

Furthermore, a plurality of trenches 133 having the same shape as the groove 131 are formed in the circuit region of the second insulating film 13. The array pattern of the trenches 133 is the same as the array pattern of the grooves 131 and the width, length and height of the trench 133 are all the same as those of the groove 131. The trench 135 is a trench for an interconnect having a different width.

The groove 131 is slit-shaped and has, for example, a width (size in the horizontal direction in FIG. 4) of 140 nm, array pitch of 140 nm, length of L1 (size in the vertical direction in FIG. 4) of 50 µm and height (depth) of 350 nm.

The plurality of grooves 131 are arranged equidistantly and regularly and extend parallel to each other. Since the groove 131 and the trench 133 have the same shape, the shape of the trench 133 can be grasped by grasping the shape of the groove 131. Therefore, the plurality of grooves 131 can be said to be a mark for measuring the trenches.

The measuring mark formed of these plurality of grooves 131 preferably has a diameter equal to or greater than the size of a spot S of measuring light as shown in FIG. 4. For example, when the spot size (diameter) of the measuring light is 30 µm, the distance from the plane center of the measuring mark to the outer perimeter of the measuring mark is preferably 15 µm or more. By so doing, measurement can be performed reliably.

In the present embodiment, the spot size of the measuring light is 30 µm and the length L1 of one side of the measuring mark formed of the plurality of grooves 131 (length in the array direction of the grooves 131 and distance from the groove 131 on one side to the groove 131 on the other side along the array direction) is 50 µm.

The plurality of grooves 131 are all located above the light shielding film 12 in the aforementioned reservoir region 111, and are arranged without sticking out of the light shielding film 12 in a plan view seen from the substrate surface side as shown in FIG. 4. Only one light shielding film 12 is provided for the plurality of grooves 131, that is, one measuring mark.

As shown in FIG. 1, the grooves 131 are filled with a metal film 14A. This metal film 14A is similar to an interconnect film 14B with which the trenches 133 and 135 are filled and also the light shielding film 14, which will be described later, and are made of, for example, copper or a copper alloy.

The metal film 14A in the grooves 131 is insulated from the light shielding film 12 by the SiOC film 130B and SiCN film 130A of the second insulating film 13.

The reservoir region 132 has the same plane shape and size as those of the trench region 111. The height of the reservoir region 132 is greater than that of the reservoir region 111.

The light shielding film (second light shielding film) 14 is disposed in this reservoir region 132. The plane size and shape of this light shielding film 14 is the same as those of the light shielding film 12. Furthermore, the material of the light shielding film 14 is also the same as that of the light shielding film 12.

The third insulating film 15 is formed on the second insulating film 13.

This third insulating film 15 has the same layer configuration as that of the second insulating film 13 and is a multilayer film where, for example, a SiCN film 150A, a SiOC film 150B and a SiO2 film 150C are multilayered in that order.

The third insulating film 15 is also formed extending over the circuit region to the scribe region as in the case of the first insulating film 11 or the like. A reservoir region (third reservoir region) 152 and a plurality of grooves 151 (second concave portion) are formed in the part located in the scribe region of this third insulating film 15. The reservoir region 152 is formed at a predetermined distance from the plurality of grooves 151.

The reservoir region 152 and grooves 151 penetrate the SiO2 film 150C of the third insulating film 15 and reaches a midway position in the thickness of the SiOC film 150B.

Furthermore, a plurality of trenches 153 are formed in the circuit region of the third insulating film 15 as in the case of the grooves 151. The array pattern of the trenches 153 is the same as the array pattern of the grooves 151 and the width, length and height of the trench 153 are all the same as those of the groove 151. The trench 155 is a trench for an interconnect having a different width.

The groove 151 is formed in a slit shape and has, for example, a width of 140 nm, array pitch of 140 nm, length of 50 µm and height of 350 nm.

The plurality of grooves 151 are all located above the light shielding film 14 in the aforementioned reservoir region 132 and arranged without sticking out of the light shielding film 14 in a plan view seen from the substrate surface side.

The groove 151 is filled with a metal film 15A. This metal film 15A is similar to an interconnect film 15B with which the trenches 153 and 155 are filled and are made of, for example, copper or a copper alloy.

The metal film 15A in the grooves 151 is insulated from the light shielding film 14 by the SiOC film 150B and the SiCN film 150A of the third insulating film 15.

The reservoir region 152 has the same size and shape as those of the reservoir region 132.

The light shielding film (third light shielding film) 16 is disposed in this reservoir region 152. The size and shape in a plan view of this light shielding film 16 are the same as those of the light shielding film 12. The material of the light shielding film 16 is also the same as that of the light shielding film 12. The fourth insulating film 17 is provided on the third insulating film 15.

This fourth insulating film 17 has the same layer configuration as that of the second insulating film 13 and is a multilayer film in which, for example, a SiCN film 170A, a SiOC film 170B and a SiO2 film 170C are multilayered in that order.

As in the case of the first insulating film 11 or the like, the fourth insulating film 17 is also formed extending over the circuit region to the scribe region. A plurality of grooves (third concave portion) 171 are formed in the part located in the scribe region of this fourth insulating film 17.

The grooves 171 penetrate the SiO2 film 170C of the fourth insulating film 17 and reach a midway position in the thickness of the SiOC film 170B.

Furthermore, trenches 173 having the same shape as that of the grooves 171 are formed in the circuit region of the fourth insulating film 17. The array pattern of the trenches 173 is the same as the array pattern of the grooves 171 and the width, length and height of the trenches 173 are all the same as those of the grooves 171. The trench 175 is a trench for an interconnect having a different width.

The groove 171 is slit-shaped and has, for example, a width of 140 nm, array pitch of 140 nm, length of 50 μm and height of 350 nm.

The plurality of grooves 171 are all located above the light shielding film 16 in the aforementioned reservoir region 152 and located without sticking out of the light shielding film 16 in a plan view seen from the substrate surface side.

This groove 171 is filled with a metal film 17A. This metal film 17A is similar to that of an interconnect film 17B with which the trenches 173 and 175 are filled and are made of, for example, copper or a copper alloy.

The metal film 17A in the groove 171 is insulated from the light shielding film 16 by the SiOC film 170B and SiCN film 170A of the fourth insulating film 17.

In the above described semiconductor device, the plurality of grooves 131 are disposed above the light shielding film 12, the light shielding film 16 is disposed above the plurality of grooves 131 and the grooves 171 are disposed above the light shielding film 16.

On the other hand, the grooves 151 are formed above the light shielding film 14.

Next, the method of manufacturing the semiconductor device 1 will be explained with reference to FIGS. 2 and 3.

First, the transistor 10 having a gate structure and a diffusion region and an insulating layer 110 and the insulating film 11 are formed on the semiconductor substrate 100.

Next, the insulating film 11 is selectively removed by etching and the reservoir region 111 is formed. The reservoir region 111 is then filled and a metal film (light shielding layer) is formed so as to cover the surface of the insulating film 11. The metal film is then polished by CMP and only the metal film is left in the reservoir region 111. In this way, the light shielding film 12 is formed (FIG. 2A). In the same time, an interconnect 121 is formed.

Next, the insulating film 13 is provided on the insulating film 11. Continually, insulating film 13 is etched to form a via hole 134 with a mask in the circuit region. Because the insulator film 130A is not etched when the via hole is formed, it may be done to measure the shape of the via hole as described in the second embodiment.

Further, the mask to form the trench connecting with the via hole 134, the reservoir region 132 and grooves 131 is formed on the insulating film 13. The insulating film 13 is then selectively removed by etching, the reservoir region 132 and grooves 131 are formed in the scribe region of the insulating film 13 and the interconnect hole 136 having a trench 133 and a via hole 134 is formed in the circuit region (FIG. 2B).

Next, the plurality of grooves 131 are irradiated with light, reflected light is detected and the shape of the grooves 131 is acquired from the detected reflected light.

Here, examples of the method of acquiring the shape of the grooves 131 from the reflected light include a scatterometry method (light scattering measuring method). According to this method, a database is created beforehand which associates the shape of the grooves (e.g., depth (height) of the grooves, width of the grooves, angle of the side wall with respect to the bottom surface of the grooves or the like) with the waveform of reflected light. Light is irradiated onto the grooves 131 and the waveform of the reflected light is compared with the waveform in the database. When the waveform of the reflected light matches the waveform in the database, the shape of the grooves associated with the waveform in the database is understood as an optimal value of the actual shape of the grooves.

Since the plurality of grooves 131 have a size and shape similar to those of the trenches 133 formed in the circuit region and also have a similar array pattern, when the grooves 131 have a desired shape, it is possible to judge that the trenches 133 formed in the circuit region have a desired shape.

On the other hand, when the grooves 131 do not have the desired shape, the trenches 133 in the circuit region are also estimated not to have a desired shape. Semiconductor devices in which the trenches 133 in the circuit region do not have the desired shape are excluded so as not to move to the next step.

Furthermore, the difference between the shape of the grooves 131 and the desired shape is acquired and etching conditions such as an etching time are adjusted. In this way, a desired shape is obtained when trenches 133 in the next semiconductor device are formed.

Next, the reservoir region 132, grooves 131 and the interconnect hole 136 having a trench 133 and a via hole 134 are filled and a metal film (light shielding layer) for covering the surface of the insulating film 13 is formed. Then, after polishing by CMP, this metal film remains in the reservoir region 132, grooves 131 and the interconnect hole 136 having a trench 133 and a via hole 134. In this way, the light shielding film 14, metal film 14A and interconnect 14B in the grooves 131 are formed.

Next, as shown in FIG. 3A, the insulating film 15 is provided on the insulating film 13. Continually, insulating film 15 is etched to form a via hole 154 with a mask in the circuit region. Because the insulator film 150A is not etched when the via hole is formed, it may be done to measure the shape of the via hole as described in the second embodiment.

Further, the mask to form the trench connecting with the via hole 154, the reservoir region 152 and grooves 151 is formed on the insulating film 13. After that, the insulating film 15 is selectively removed by etching and reservoir region 152 and grooves 151 are formed in the scribe region of the insulating film 15 and the interconnect hole 156 having a trench 153 and a via hole 154 is formed in the circuit region.

The shape of the groove 151 is acquired using the same method as that for acquiring the shape of the groove 131 and it is judged whether or not the trenches 153 have a desired shape. When the trenches 153 do not have the desired shape, this semiconductor device is excluded so as not to move to the next step.

Furthermore, the difference between the shape of the groove 151 and the desired shape is acquired and etching conditions such as an etching time are adjusted. When the trenches 153 are formed in the next semiconductor device, this allows the trenches 153 to have the desired shape.

Next, the metal film (light shielding layer) is formed to fill the reservoir region 152, grooves 151 and trenches 153 and cover the surface of the insulating film 15. Then, after polishing by CMP, this metal film remains in the reservoir region 152, grooves 151 and the interconnect hole 156 having a trench 153 and a via hole 154. In this way, the light shielding film 16, the metal film 15A in the grooves 151 and interconnect 15B are formed.

Next, as shown in FIG. 3B, the insulating film 17 is provided on the insulating film 15.

After the masks to form a via hole 174 and a trench are formed on the insulating film 17, as described above, the insulating film 17 is then selectively removed by etching and the grooves 171 are formed in the scribe region of the insulating film 17 and the interconnect hole 176 having a trench 173 and a via hole 174 are formed in the circuit region. It may be done to measure the shape of the via hole 174 as described in the second embodiment.

The shape of the groove 171 is acquired using the same method as for acquiring the shape of the grooves 131 and it is judged whether or not the trenches 173 have the desired shape. When the trenches 173 do not have the desired shape, this semiconductor device is excluded so as not to move to the next step.

Furthermore, the difference between the shape of the groove 171 and the desired shape is acquired and etching conditions such as an etching time are adjusted. When the trenches 173 are formed in the next semiconductor device, this allows the trenches 173 to have the desired shape.

Next, the metal film (light shielding layer) is formed so as to fill the grooves 171 and the interconnect hole 176 having a trench 173 and a via hole 174, and cover the surface of the insulating film 17. Then, after polishing by CMP, this metal film remains in the grooves 171 and the interconnect hole 176 having a trench 173 and a via hole 174. In this way, the metal film 17A in the grooves 171 and the interconnect film 17B in the interconnect hole 176 having a trench 173 and a via hole 174 are formed.

The semiconductor device 1 is completed in the above described steps.

Next, the operations and effects of the present embodiment will be explained.

According to the present embodiment, since the distance from the center to the outer perimeter in a plan view of the light shielding films 12, 14 and 16 is assumed to be 2 μm or more, it is possible to suppress the occurrence of erosion in the insulating films 11, 13 and 15 when the light shielding films 12, 14 and 16 are formed by polishing by CMP. Especially, the light shielding films 12, 14 and 16 are singly arranged only one each and the respective light shielding films are not arranged in the plural, and it is thereby possible to reliably suppress the occurrence of erosion.

Therefore, even if there is an alignment error in the arrangement of the openings of masks to form the grooves 131, 151 and 171, variations in the shapes of the grooves 131, 151 and 171 are suppressed. Therefore, measurement can be conducted with the measuring conditions set to certain conditions and productivity can be improved.

Furthermore, since the occurrence of erosion in the insulating film 11 can be prevented, it is possible to prevent steps from being formed due to the influence of erosion on the surface of the insulating film 13 formed on the insulating film 11.

When the grooves 131 are measured, this can inhibit the measuring light from being reflected by steps causing errors in the measured value of the grooves 131.

Similar effects can also occur when the grooves 151 and 171 are formed.

Furthermore, the distance from the center to the outer perimeter of the light shielding film 12 in the plan view is set to 2 μm or more. When the groove pattern is irradiated with light, the reflected light is detected and the shape of the grooves 131 is measured, this can prevent the reflected light from layers underlying the light shielding film 12 from mixing up. This allows the shape of the grooves 131 to be accurately grasped.

Since the distance from the center to the outer perimeter of the light shielding films 14 and 16 in the plan view is also set to 2 μm or more, the shape of the grooves 151 and 171 can also be grasped accurately as in the case of the grooves 131.

Furthermore, according to the present embodiment, the light shielding film 12 has a size equal to or more than the spot size of light irradiated onto the grooves 131. According to a scatterometry method, since the spot size of light is generally 30 μm, setting the distance from the center to the outer perimeter of the light shielding film 12 in a plan view to 30 μm or more can prevent light from passing below the light shielding film 12.

In this way, it is possible to prevent information on layers underlying the light shielding film 12 from being included in the reflected light from the grooves 131 and accurately grasp the shape of the grooves 131.

Similar effects can also be obtained with the light shielding films 14 and 16 because the light shielding films 14 and 16 are set to a size equal to or greater than the spot size of light irradiated onto the grooves 151 and 171.

Furthermore, in the measuring device that measures grooves, the present embodiment takes an alignment error between the stage for setting the substrate on which the insulating films or the like are multilayered and the irradiation section that irradiates measuring light into consideration and sets the size of the light shielding films 12, 14 and 16 in the plan view to a size equal to or greater than the sum of the spot size of the measuring light and the alignment error, and can thereby grasp the shapes of the grooves 131, 151 and 171 more accurately.

On the other hand, the present embodiment sets upper limits of the sizes of the light shielding films 12, 14 and 16 such that the distance from the center to the outer perimeter of the light shielding films 12, 14 and 16 is 40 μm, and can thereby prevent the scribe region from being narrowed by the light shielding films 12, 14 and 16.

Furthermore, the present embodiment forms the light shielding films 12, 14 and 16 and grooves 131, 151 and 171 in the scribe region, and can thereby prevent the circuit region from being narrowed by the light shielding films 12, 14 and 16 and grooves 131, 151 and 171.

Furthermore, the present embodiment arranges the plurality of grooves 131 above the light shielding film 12, arranges the light shielding film 16 above the plurality of grooves 131 and arranges the grooves 171 above the light shielding film 16. Furthermore, the present embodiment arranges the grooves 151 above the light shielding film 14.

Adopting such a configuration minimizes the space in a plan view in which the grooves and light shielding films are formed. Various marks such as alignment marks may be formed in the scribe region. When the light shielding films and grooves are formed in the scribe region, it is possible to effectively use the scribe region for a variety of applications without narrowing the scribe region.

Second Embodiment

A second embodiment of the present invention will be explained with reference to FIG. 5.

Figure 5A:
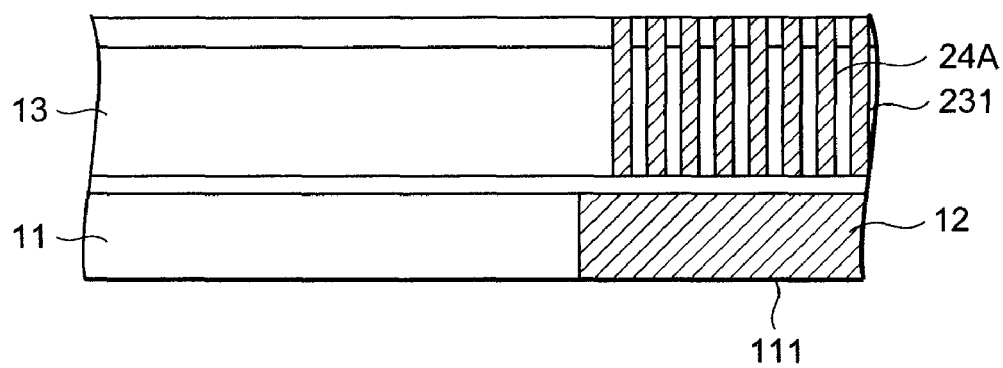
FIGS. 5A and 5B show a semiconductor device according to a second embodiment of the present invention.

In the above described embodiment, gratings 131, 151 and 171 are formed, but in the present embodiment, a plurality of cylindrical holes 231 are formed instead as shown in FIG. 5.

The plurality of holes 231 are formed in the scribe region as in the case of the above described embodiment, and via holes (not shown) having a size similar to that of the holes 231 are formed in the circuit region of the insulating film 13. The array pattern of the via holes is the same as the array pattern of the holes 231.

Figure 5B:
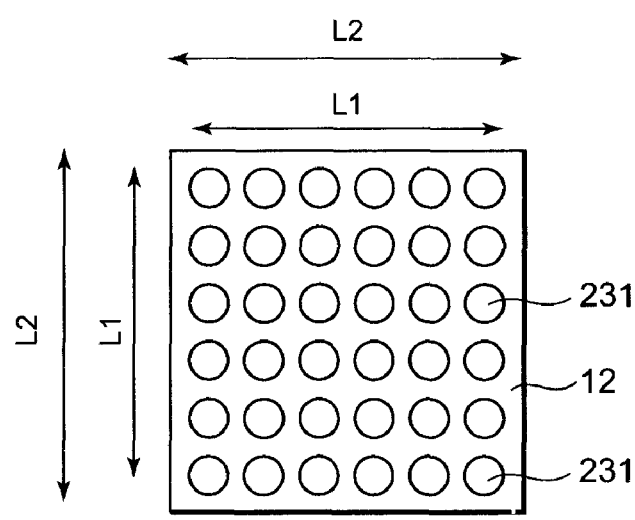
Figure 6:
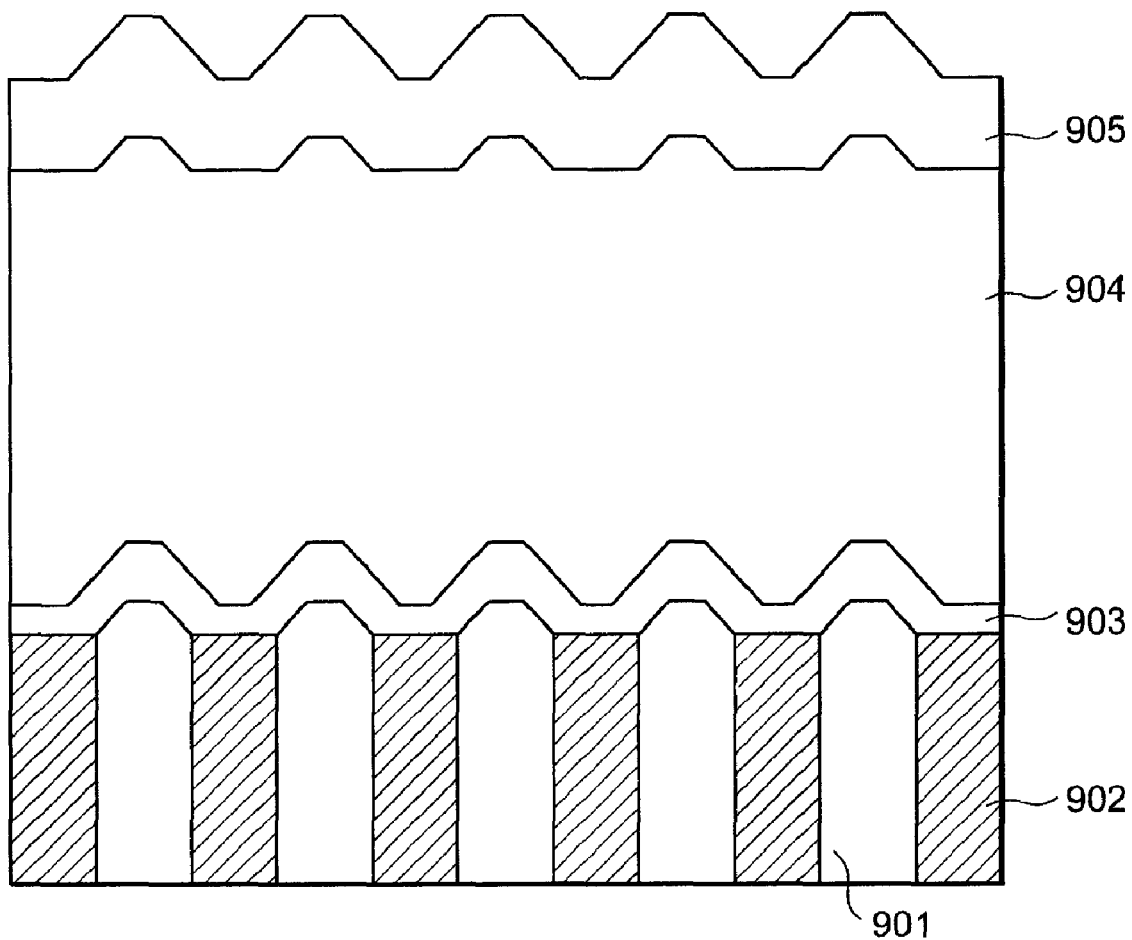
FIG. 6 shows a related art of a semiconductor device.

Furthermore, as shown in FIG. 5B, the plurality of holes 231 are formed so as not to stick out of the light shielding film 12 in a plan view.

The holes 231 are filled with a metal film 24A. This metal film 24A is similar to the metal film 14A and is made of a material similar to that for the vias with which the via holes are filled.

The rest of aspects are the same as those of the above described embodiment.

The present embodiment can exert effects similar to those in the above described embodiment and can further exert the following effects.

To acquire the shape of a via hole (e.g., size of the bottom of the via hole), a length measuring SEM (Scanning Electron microscope) is conventionally used. In contrast, use of a scatterometry method as in the case of the present embodiment does not take much time for measurement.

The present invention is not limited to the aforementioned embodiments, but modifications, improvements or the like within the scope in which the object of the present invention can be achieved are included in the present invention.

For example, when measuring the shape of the grooves 131 or the like, the above described embodiments compare the waveform of reflected light from the grooves 131 with waveforms in the database beforehand and determine the shape of the grooves from the matching waveform in the database.

However, the method of measuring the shape of the grooves 131 or the like is not limited to such a method, but it is also possible to grasp the shape of the grooves 131 or the like based on the intensity of reflected light from the grooves 131 or the like as in the case of Patent Document 1.

Furthermore, the above described embodiments form the grooves 131 or the like and a light shielding film 12 or the like in the scribe region, but the present invention is not limited to this and these may also be formed in the circuit region.

Furthermore, the first embodiment assumes that the plurality of grooves 131 are arranged above the light shielding film 12, the light shielding film 16 is arranged above the plurality of grooves 131 and the grooves 171 are arranged above the light shielding film 16, but the present invention is not limited to such a structure. That is, the light shielding film 16 may also be provided at a location shifted from the location above the plurality of grooves 131.

Furthermore, the above described embodiments arrange the plurality of grooves 131 so as not to stick out of the light shielding film 12 in the plan view seen from the substrate surface side, but the present invention is not limited to this and the grooves 131 may also be arranged such that parts of the grooves 131, for example, an end in the longitudinal direction of the grooves 131 sticks out of the light shielding film 12.

However, by arranging the plurality of grooves 131 so as not to stick out of the light shielding film 12 as in the cases of the above described embodiments, it is possible to reliably intercept the information of layers underlying the light shielding film 12 when measuring the shape of the grooves 131.

EXAMPLES

Next, examples of the present invention will be explained.

Example 1

As in the case of the first embodiment, the light shielding film 12 was formed in the insulating film 11. The light shielding film 12 was assumed to be a square of 4 μm per side. CMP was applied when the light shielding film 12 was formed, but no erosion occurred.

Furthermore, the insulating film 13 was provided on the light shielding film 12, but the surface of the insulating film 13 was flat and no projections and depressions were formed. The plurality of grooves 131 and trenches 133 were then formed in the insulating film 13.

The width (length in the short side direction) of the groove 131 and a trench 133 was 140 nm, the height was 370 nm and the depth (length in the long side direction) of the groove 131 and a trench 133 was 50 μm.

The length L1 of one side of the square measuring mark made up of the plurality of grooves 131 was 50 μm.

No erosion occurs if the size of the light shielding film 12 is determined such that the distance from the center to the outer perimeter is 2 μm or more. Therefore, even when an error occurs in the location where the opening of the mask is formed when the plurality of grooves 131 and trenches 133 are formed, variations in the shapes of the plurality of grooves 131 and trenches 133 are suppressed. Furthermore, since no projections and depressions are formed on the surface of the insulating film 13, it is understandable that it is possible to suppress the reflection of measuring light by steps and the occurrence of measurement errors.

Furthermore, the grooves 131 were measured using a scatterometry method. The spot size of measuring light was assumed to be 30 μm. The grooves 131 could be measured in Example 1.

Example 2

As in the case of the first embodiment, the light shielding film 12 was formed in the insulating film 11. The light shielding film 12 was assumed to be a square having the length L2 of 60 μm per side. The insulating film 13 was provided on the light shielding film 12 and the plurality of grooves 131 and trenches 133 were formed in the insulating film 13.

The length L1 per side of the square measuring mark made up of the plurality of grooves 131 was assumed to be 50 μm. The grooves 131 were measured using a scatterometry method. The spot size of the measuring light was set to 30 μm here.

Table 1 shows the depth of the bottom of the plurality of groove 131 measured using the scatterometry method and the depth of the plurality of grooves 131 measured using a cross-sectional SEM as in the case of the first embodiment.

TABLE 1

| Measured value (nm) using scatterometry method | Cross-sectional SEM value (nm) |
| --- | --- |
| 378.6 | 377 |
| 376.5 | 377 |
| 388.4 | 390 |
| 378.1 | 380 |
| 396.2 | 394 |
| 388.9 | 387 |
| 377.3 | 380 |
| 380.7 | 377 |
| 390.3 | 390 |

This table shows that accurate measurement is made possible by providing the light shielding film.

CMP was applied when the light shielding film was provided but no erosion was found.

Example 3

In Example 3, the light shielding film 12 was formed in the insulating film 11 as in the case of the second embodiment.

The light shielding film 12 was assumed to be a square having the length L2 of 60 μm per side. The insulating film 13 was provided on the light shielding film 12 and a plurality of holes 231 and via holes were formed in the insulating film 13.

The length L1 of one side of the square measuring mark made up of the plurality of holes 231 (length from the hole 231 at an end of one side of the square to the hole 231 at the other end) was assumed to be 50 μm.

The rest of aspects are the same as those in Example 2.

The widths of the bottom of 17 holes 231 in the plane of the semiconductor substrate were measured using a scatterometry method. Furthermore, the widths of the bottom of 17 holes 231 were measured using a length measuring SEM.

Table 2 shows the results.

TABLE 2

|  | Measured value (nm) using scatterometry method | Cross-sectional SEM value (nm) |
|---|---|---|
| Mean value (nm) | 115.8 | 115.8 |
| 3σ (nm) | 5.2 | 3.2 |
| Max (nm) | 118.0 | 117.6 |
| Min (nm) | 112.2 | 113.7 |

This table shows that accurate measurement is made possible by providing the light shielding film.

CMP was applied when the light shielding film was provided, but no erosion was found.

Comparative Example 1

An insulating film was provided on a semiconductor substrate and trenches having a width of 175 nm, a height of 250 nm and a pitch of 350 nm were formed in this insulating film. Next, a tungsten metal film was formed so as to fill these trenches and cover the insulating film and was then polished for planarization.

In this case, erosion occurred in the insulating film and projections and depressions were formed on the surface of the insulating film.

Next, a second insulating film was provided on the insulating film and trenches having a width of 175 nm, a height of 250 nm and a pitch of 350 nm were formed in the second insulating film. Projections and depressions were formed on the surface of the second insulating film due to an influence of erosion.

When the shape of the trenches was measured as in the case of Example 2, a large difference between the measured value using a SEM and the measured value using scatterometry method was observed due to the projections and depressions on the surface of the second insulating film.

What is claimed is:

1. A method of manufacturing a semiconductor device, comprising:
    forming a first insulating film on a substrate where a plurality of active regions and a plurality of test regions are formed;
    forming a light shielding film in the test regions and an interconnect film in the active regions in the first insulating film;
    forming a second insulating film on the first film; and
    forming an optical test pattern above the light shielding film in the second insulating film and in the test regions, and an interconnect hole having a via hole and device components in the active regions in the second insulating film,
    wherein the light shielding film extends continuously in an area underlying the optical test pattern.

2. The method of manufacturing a semiconductor device according to claim 1, further comprising:
    irradiating light onto the optical test pattern in the second insulating film;
    detecting reflected light; and
    acquiring a shape of the optical test pattern from the detected reflected light.

3. The method of manufacturing a semiconductor device according to claim 1, wherein the test regions are included in a scribe region.

4. The method of manufacturing a semiconductor device according to claim 1, wherein the area of the light shielding film is an area of the circle of 2 μm or more in the radius.

5. The method of manufacturing a semiconductor device according to claim 1, wherein the device components and the optical test pattern includes trenches being formed at a same etching step.

6. The method of manufacturing a semiconductor device according to claim 1, wherein the device components and the optical test pattern includes holes being formed at a same etching step.

7. The method of manufacturing a semiconductor device according to claim 1, wherein the light shielding film and the interconnect film are formed of copper or copper alloy.

* * * * *